United States Patent [19]

Schwabe et al.

[11] 4,257,832

[45] Mar. 24, 1981

[54] PROCESS FOR PRODUCING AN INTEGRATED MULTI-LAYER INSULATOR MEMORY CELL

[75] Inventors: Ulrich Schwabe, Vaterstetten; Erwin Jacobs, Munich, both of Fed. Rep. of Germany

[73] Assignee: Siemens Aktiengesellschaft, Berlin & Munich, Fed. Rep. of Germany

[21] Appl. No.: 58,555

[22] Filed: Jul. 18, 1979

[30] Foreign Application Priority Data

Jul. 24, 1978 [DE] Fed. Rep. of Germany ....... 2832388

[51] Int. Cl.³ .............................................. H01L 21/22
[52] U.S. Cl. .................................... 148/187; 148/1.5; 148/188; 148/189
[58] Field of Search ................. 148/187, 1.5, 188, 189

[56] References Cited

U.S. PATENT DOCUMENTS

| | | | |
|---|---|---|---|
| 3,873,372 | 3/1975 | Johnson | 148/1.5 |
| 4,001,048 | 1/1977 | Meiling et al. | 148/187 X |
| 4,102,733 | 7/1978 | De La Moneda et al. | 148/187 X |
| 4,140,548 | 2/1979 | Zimmer | 148/1.5 |
| 4,149,307 | 4/1979 | Henderson | 148/187 X |

OTHER PUBLICATIONS

Chen, *IEEE Transactions on Electron Devices*, vol. ED-24, May 1977, pp. 584–586.

*Primary Examiner*—G. Ozaki
*Attorney, Agent, or Firm*—Hill, Van Santen, Steadman, Chiara & Simpson

[57] ABSTRACT

An integrated multi-layer insulator memory cell is produced via silicon-gate technology, with self-adjusting, overlapping polysilicon contact wherein a gate oxide of a peripheral transistor is produced after the application of multi-layer insulating layer comprised of a storage layer and a "blocking" layer. The "blocking" layer consists of an oxynitride layer formed by oxidation of a silicon nitride layer surface or an additionally applied $SiO_2$ layer and has a layer thickness of about 5 to 30 nm. Such "blocking" layer prevents an undesired injection of charge carriers from the silicon-gate electrode. It also provides means for forming a self-adjusting, overlapping polysilicon contact.

9 Claims, 7 Drawing Figures

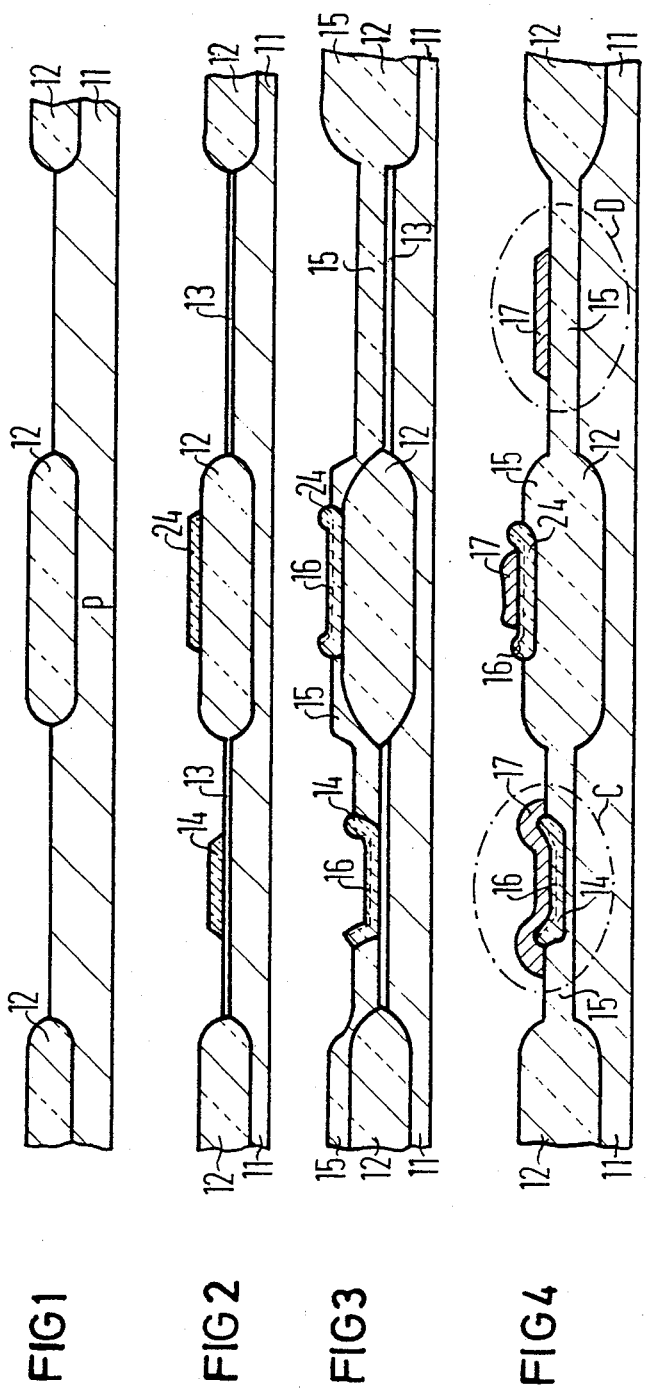

PROCESS FOR PRODUCING AN INTEGRATED MULTI-LAYER INSULATOR MEMORY CELL

BACKGROUND OF THE INVENTION

1. Field of the Invention

The invention relates to a process for producing an integrated multi-layer insulator memory cell via silicon gate technology with a self-adjusting overlapping polysilicon contact as well as the so-attained integrated memory cell.

2. Prior Art

Currently, polysilicon-gate technology is used with preference in the production of MOS components, and particularly for memory circuits. In this technology, the gate electrodes of field effect transistors and conductor paths for connection of these electrodes are formed from polysilicon. The main advantage of this technology, in comparison to one in which the electrodes and conductor paths are composed of aluminum, consist in that the disturbing gate-source overlap capacitance and gate-drain overlap capacitance can be kept very small and an additional "conductor path" plane is provided in the form of the polysilicon layer.

The construction of a MNOS component differs from that a MOS component in that the gate dielectric consists of two layers, an upper layer composed of silicon nitride ($Si_3N_4$) and a lower layer composed of silicon dioxide ($SiO_2$). MNOS technology is used for electrically reprogrammable fixed work stores. These stores or memories are smaller and require only one transistor per memory cell which results in high packing density.

"IEEE Transactions On Electron Devices", Vol Ed-b 24, No. 5, May 1977, pages 584–586 discloses a Si-gate-MNOS structure in an example of a capacitance produced in a P-type silicon substrate. In this arrangement, the production of an oxynitride layer by the oxidation of a silicon nitride surface prevents an undesired charge carrier injection from the silicon-gate electrode, which would lead to the disintegration and partial erasure of the stored information. In the following specification and claims, this layer will be referred to as a "blocking" layer.

SUMMARY OF THE INVENTION

In accordance with the principles of the invention, an integrated multi-layer insulator memory cell with a self-adjusting, overlapping polysilicon contact is produced via silicon gate technology by performing gate oxidation of a peripheral transistor after the application of a multi-layer insulator layer comprised of a storage and a "blocking" layer on a centralized transistor in a multi-transistor memory cell arrangement.

By following the principles of the invention one can produce an EAROM (electrically alternable, read only memory) storage arrangement as well as a memory circuit having the greatest possible packing density in the fewest possible steps.

In an exemplary process following the principles of the invention, a combination of sequential steps are utilized to produce an integrated MNOS storage cell via silicon-gate technology having a self-adjusting, overlapping polysilicon contact. Such steps comprise:

(a) producing a structured $SiO_2$ layer on a semiconductor substrate in order to separate active transistor zones from one another in accordance with the so-called LOCOS- or isoplanar-process;

(b) oxidizing the entire substrate surface with a relatively thin $SiO_2$ layer, which functions as a tunnel oxide;

(c) producing a structured $Si_3N_4$ layer in the region of a storage transistor and an overlapping contact;

(d) applying a gate oxide layer via oxidation and substantially simultaneous transforming the surface of the $Si_3N_4$ layer into an oxynitride layer, which functions as a "blocking" layer;

(e) depositing a polysilicon layer onto the entire surface and thereafter structuring such polysilicon layer;

(f) producing source-drain zones;

(g) depositing a $SiO_2$-layer, over the entire surface and thereafter structuring such $SiO_2$ layer so as to function as an intermediate oxide;

(h) producing contact holes to the source-drain zones and to the polysilicon layer above a thick oxide zone; and (i) depositing metal over the entire surface and thereafter structuring such metal layer into contacts.

In accordance with the principles of the invention, the source-drain zones in the substrate can be produced via ion-implantation. However, a diffusion process can also be utilized.

By proceeding in accordance with the principles of the invention, the oxidation step carried out after the nitride coating of a memory or store, which acts in a manner of a second local oxidation and forms the gate oxide for the peripheral, normal transistor, avoids the need of a masking process. This is in contrast with conventional Si-gate-MNOS structuring wherein the gate oxide is formed prior to the nitride coating. As a result of proceeding in accordance with the principles of the invention, the overall process is substantially more economical because error sources due to additional processing steps are eliminated and the yield losses are materially reduced. Further, time outlays and costs associated with additional process steps are avoided.

BRIEF DESCRIPTION OF THE DRAWINGS

FIGS. 1–6 are somewhat schematic elevational views of a production sequence in accordance with the principles of the invention utilized in producing an integrated n-channel-MNOS-memory cell via silicon-gate technology.

DESCRIPTION OF THE PREFERRED EMBODIMENT

Figures 5, 6:
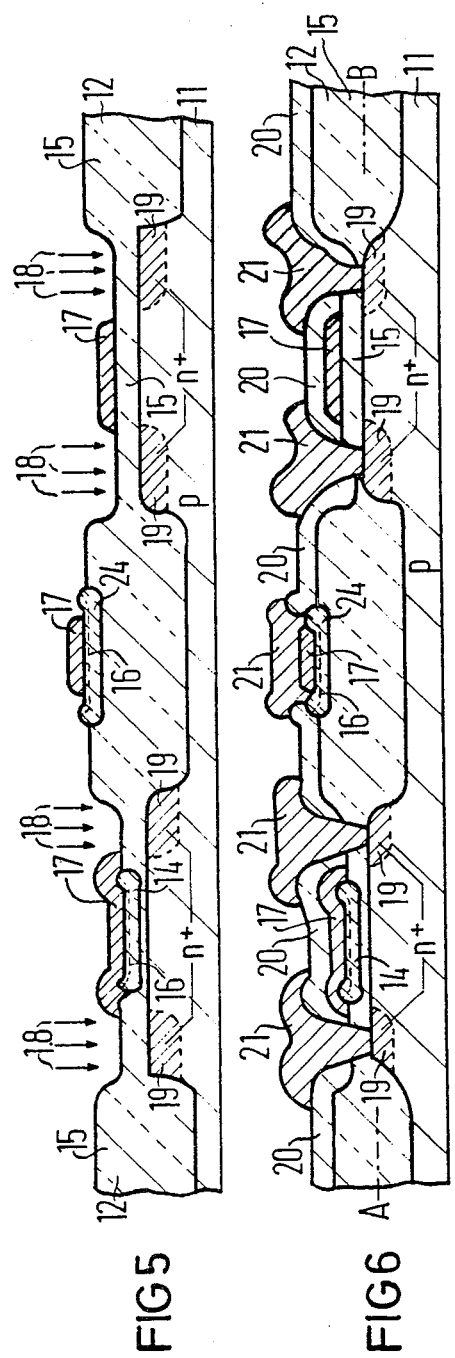

In the drawings, like reference numerals refer to like zones or components.

As shown in FIG. 1, a p-doped (100) -orientated silicon substrate 11, preferably having a resistance of about 2 to 20 $\Omega$.cm is provided, via an isoplanar process, also referred to as a LOCOS(local oxidation of silicon)-process, with structured $SiO_2$ layers 12. The $SiO_2$ layers 12 separate active transistor zones from one another. Although not illustrated in the drawing, during this process the p-doped silicon substrate 11 is first provided with about a 100 nm thick silicon oxide layer and about a 200 nm thick silicon nitride layer. Following the structuring, a $SiO_2$ layer having a thickness of about 1000 nm is oxidized onto the silicon substrate and functions as a thick oxide zone. Thereafter the silicon nitride layer is removed.

In the next processing step, as shown at FIG. 2, a relatively thin $SiO_2$ layer 13, functioning as a tunnel oxide, is deposited onto the entire substrate surface.

Layer 13 has a thickness of about 1.5 nm to 12 nm and preferably is about 3 nm thick. Then a so-called storage nitride layer (14, 24) is applied in a layer thickness ranging from about 20 to 60 nm and preferably in a thickness of about 50 nm, and structured using masks in such a manner that such nitride layer remains in the region of of the storage transistor 14 and at the location 24 of the poly-Si/metal contact, which is to be produced later. Alternatively, an oxynitride layer of a different composition ($Si_xO_yN_z$) wherein x, y and z are numerals, can be provided in place of the silicon nitride layer. As a further alternative, a silicon nitride layer having a thickness of about 20 to 60 nm can be positioned above an $Al_2O_3$-layer, which assumes the function of the tunnel oxide and has a thickness of about 1.5 nm to 12 nm. Yet further, a $Si_3N_4$-$Al_2O_3$-double layer or an $AlN$-$Si_3N_4$-double layer can be produced in place of the silicon nitride layer.

Next, as illustrated in FIG. 3, a 50 to 100 nm thick (preferably about 50 nm) $SiO_2$-layer, functioning as a gate oxide 15, is applied and substantially simultaneously the zone above the silicon nitride layer surface is transformed into an approximately 5 to 30 nm thick (preferably 20 nm) oxynitride layer 16. In the alternative, one can also apply a $SiO_2$-layer having a thickness of about 5 to 30 nm in place of the oxynitride layer and both such layers functions as a "blocking" layer.

Then, as shown at FIG. 4, a polysilicon layer 17 is deposited in a thickness of about 100 to 1000 nm (preferably 500 nm) and is structured. For the sake of clarity, the two $SiO_2$-layers 13 and 15 have been shown as a single layer 15. The zone outlined in a dash-dotted line C in FIG. 4 denotes a sub-zone of the storage transistor whereas the dash-dotted line D encloses a normal transistor of an overall arrangement. Thus, by following the principles of the invention at least one peripheral normal MOS-transistor is produced substantially simultaneously with a storage transistor.

Thereafter, as shown at FIG. 5, source-drain zones are produced, for example by making an arsenic ion-implantation of about $1 \times 10^{15}$ to $1 \times 10^{16}$ $As^+cm^{-2}$ at about 20 to 300 KeV (schematically shown by arrows 18). In an exemplary embodiment, arsenic ion-implantation of about $5 \times 10^{15}$ $As^+cm^{-2}$ at 150 KeV was utilized. As a result $n^+$-zones 19 are formed. Of course, a dopant-diffusion process can also be utilized.

After the implantation has been completed, an intermediate oxide layer 20 is applied in a thickness of about 500 nm and is structured for the production of contact holes, as illustrated at FIG. 6. Using a metal mask, the contact-metal-layers 21 are applied in the region of the contact holes and the entire arrangement is then covered with a protective oxide mask (not shown in the drawings), for example composed of phosphorus glass.

As can be deduced from the overall process sequence of the invention, the production of a gate oxide after the storage nitride saves at least one masking step in comparison with a typical Si-gate MNOS-process. Due to the overlapping of the polysilicon layer over the oxidized storaged nitride layer (best seen at zone C in FIG. 4) the different insulator layer thicknesses form a so-called split-gate structure which prevents undesirable drain-substrate leaks and ensures a high degree of operating reliability.

The polysilicon layer 17 for the poly-Si/metal contact above the thick oxide zone 12 (center proportion of FIGS. 4-6) is positioned, not as normally on $SiO_2$, but on the $Si_3N_4$ layer 14, 24. Under-etching of the polysilicon layer 17 at the position of the contact hole 21 (center area of FIG. 6) which can lead to an edge fracture of the metal paths, no longer occurs because the nitride layer (14, 24) functions as an etch stop. This results in the production of a self-adjusting overlying polysilicon contact with an oversize contact hole.

Figure 7:
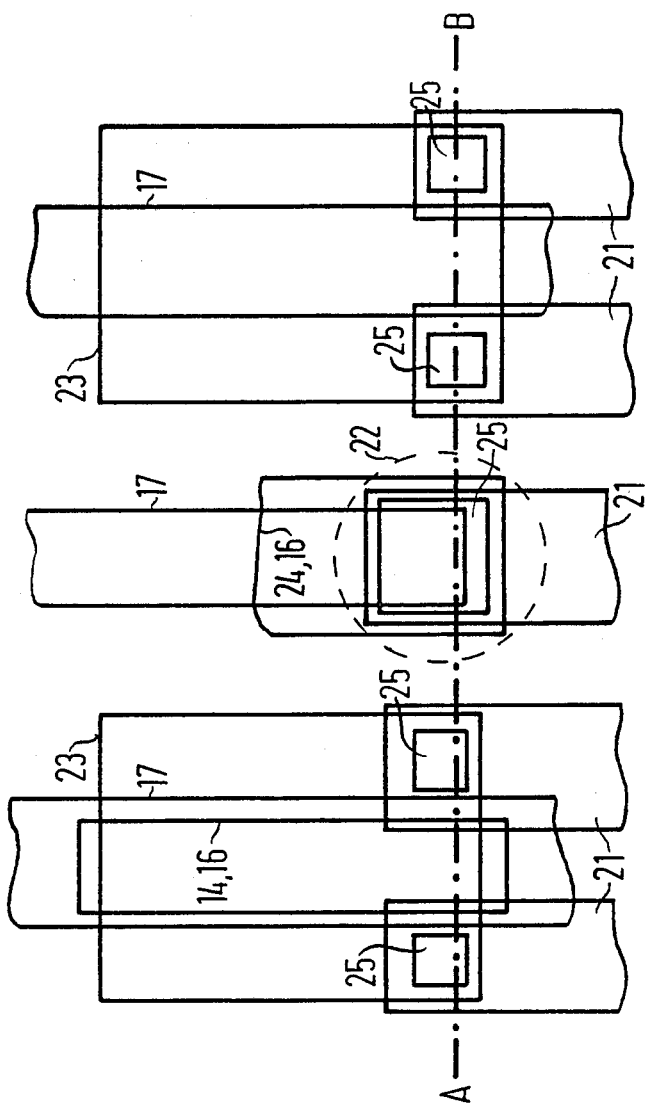
FIG. 7 is a plan view of a completed arrangement of such memory cell taken along lines A–B of FIG. 6.

FIG. 7 is a plan view of the position of the individual paths relative to one another along section line A-B of FIG. 6. The zone enclosed by broken line 22 represents a self-adjusting overlying contact. Such self-adjusting, overlying contact with an oversize contact hole provides a considerable increase in the integration density of a storage circuit. The various other enumerated components and/or zones are identical to those explained earlier in conjunction with FIGS. 1-6. The illustrated zone 23 shows the LOCOS-troughs of the arrangement. Zone 25 shows the contact holes.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing an integrated multi-insulator memory cell with a self-adjusting overlying polysilicon contact using silicon gate technology comprising applying a relatively thin $SiO_2$ layer having a thickness of about 1.5 to 12 nm onto the semiconductor substrate and applying an oxynitride layer of a composition ($Si_xO_yN_z$) wherein x, y and z are integers having a thickness of about 20 to 60 nm above said $SiO_2$ layer with said $SiO_2$ layer functioning as a tunnel oxide and said oxynitride layer functioning as a storage layer, and wherein a gate oxide layer having a thickness of about 50 to 100 nm is produced by a further oxidation of said substrate.

2. A process for producing an integrated multi-layer insulator memory cell with a self-adjusting, overlying polysilicon contact using silicon gate technology comprising applying a multi-layer insulator comprising a relatively thin $SiO_2$ layer having a thickness of about 1.5 to 12 nm onto the surface of the semiconductor substrate and applying at selected locations onto the relatively thin silicon dioxide layer, a silicon nitride layer having a thickness of about 20 to 60 nm wherein said thin silicon dioxide layer functions as a tunnel oxide and said silicon nitride layer functions as a storage layer, producing a gate oxide layer having a thickness of 50 to 100 nm by further oxidation of said substrate, and substantially simultaneously forming an oxynitride layer having a thickness of about 5 to 30 nm by oxidation of said silicon nitride layer and said oxynitride layer functioning as a blocking layer.

3. A process as defined in claim 2 wherein a further $SiO_2$ layer having a thickness of about 5 to 30 nm is applied over said silicon nitride layer, said further oxide layer functioning as a blocking layer.

4. A process as defined in claim 2 wherein said application of said multi-layer insulator comprises applying an $Al_2O_3$ layer having a thickness of about 1.5 to 12 nm onto the semiconductor substrate, and applying a silicon nitride layer having a thickness of about 20 to 60 nm above said $Al_2O_3$ layer, said $Al_2O_3$ layer functioning as a tunnel oxide and said silicon nitride layer functioning as the storage layer.

5. A process as defined in claim 4 wherein a Si$_3$N$_4$-Al$_2$O$_3$ double layer is applied in place of said silicon nitride layer.

6. A process as defined in claim 4 wherein an AlN-Si$_3$N$_4$ double layer is applied in place of said silicon nitride layer.

7. A process for producing an integrated multi-layer insulator memory cell with a self-adjusting, overlapping polysilicon contact using silicon-gate technology, comprising, in combination, the sequential steps:

(a) producing a structured SiO$_2$ layer on a semiconductor substrate for separation of active transistor zones from one another according to the LOCOS-process;

(b) oxidizing the entire substrate surface with a relatively thin SiO$_2$ layer, which functions as a tunnel oxide, (c) producing a structured silicon nitride layer in the region of a storage transistor and producing an overlapping contact;

(d) applying a gate oxide layer using oxidation and substantially simultaneously transforming the surface of the silicon nitride layer into an oxynitride layer, which functions as a blocking layer;

(e) depositing a polysilicon layer onto the entire substrate surface and thereafter structuring such polysilicon layer;

(f) producing source-drain zones in said substrate;

(g) depositing a silicon dioxide layer over the entire substrate surface and thereafter structuring such silicon dioxide layer so as to function as an intermediate oxide;

(h) producing contact holes to the source-drain zones and to the polysilicon layer above the thick oxide zone in said substrate; and (i) depositing metal over the entire surface of said substrate and thereafter structuring such metal layer into contacts.

8. A process as defined in claim 7 wherein said polysilicon layer is deposited in a thickness of about 100 to 1000 nm.

9. A process as defined in claim 7 wherein at least one peripheral, normal MOS-transistor is produced simultaneously with said memory cell.

* * * * *